United States Patent
Tamura

(10) Patent No.: US 10,340,120 B2
(45) Date of Patent: Jul. 2, 2019

(54) BLANKING APERTURE ARRAY, METHOD FOR MANUFACTURING BLANKING APERTURE ARRAY, AND MULTI-CHARGED PARTICLE BEAM WRITING APPARATUS

(71) Applicant: NuFlare Technology, Inc., Yokohama-shi (JP)

(72) Inventor: Takao Tamura, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/641,620

(22) Filed: Jul. 5, 2017

(65) Prior Publication Data

US 2018/0012731 A1 Jan. 11, 2018

(30) Foreign Application Priority Data

Jul. 11, 2016 (JP) .................................. 2016-136879

(51) Int. Cl.
*H01J 37/317* (2006.01)
*H01J 37/04* (2006.01)
(Continued)

(52) U.S. Cl.
CPC ........ *H01J 37/3177* (2013.01); *H01J 37/045* (2013.01); *H01J 37/3007* (2013.01);
(Continued)

(58) Field of Classification Search
CPC .. H01J 37/045; H01J 37/3045; H01J 37/3007; H01J 37/3056; H01J 37/3171; H01J 37/3177
See application file for complete search history.

(56) References Cited

U.S. PATENT DOCUMENTS

| | | | |
|---|---|---|---|
| 2010/0127185 A1* | 5/2010 | Fragner ................. | B82Y 10/00 250/398 |
| 2010/0288938 A1* | 11/2010 | Platzgummer ......... | B82Y 10/00 250/396 R |

(Continued)

FOREIGN PATENT DOCUMENTS

| JP | 2013-128031 | 6/2013 |
|---|---|---|
| JP | 2013-135166 | 7/2013 |

(Continued)

*Primary Examiner* — David E Smith
(74) *Attorney, Agent, or Firm* — Oblon, McClelland, Maier & Neustadt, L.L.P.

(57) ABSTRACT

In one embodiment, a blanking aperture array is for a multi-charged particle beam writing apparatus. The blanking aperture array includes a substrate and a plurality of blankers. Each of the plurality of blankers includes a blanking electrode and a ground electrode that are formed on a first surface of the substrate. The plurality of blankers includes at least a normal blanker which is capable of applying a predetermined voltage between the blanking electrode and the ground electrode and for which a through hole bored through the substrate is formed, and a defective blanker which is not capable of applying the predetermined voltage between the blanking electrode and the ground electrode and for which the through hole bored through the substrate is filled with a beam shield.

4 Claims, 6 Drawing Sheets

(51) Int. Cl.
*H01J 37/30* (2006.01)
*H01J 37/304* (2006.01)
*H01J 37/305* (2006.01)
B82Y 10/00 (2011.01)
B82Y 40/00 (2011.01)

(52) U.S. Cl.
CPC ...... *H01J 37/3045* (2013.01); *H01J 37/3056* (2013.01); *H01J 37/3171* (2013.01); *B82Y 10/00* (2013.01); *B82Y 40/00* (2013.01)

(56) References Cited

U.S. PATENT DOCUMENTS

| | | | | |
|---|---|---|---|---|
| 2013/0068962 | A1* | 3/2013 | Kawamoto | H01J 37/3007 250/400 |
| 2013/0164684 | A1* | 6/2013 | Yamanaka | H01J 37/09 430/296 |
| 2014/0057206 | A1* | 2/2014 | Kikuchi | H01J 37/3174 430/296 |
| 2015/0155136 | A1* | 6/2015 | Scheffers | G01B 11/14 250/206.1 |

FOREIGN PATENT DOCUMENTS

| | | |
|---|---|---|
| JP | 2013-197469 | 9/2013 |
| JP | 2015-56668 | 3/2015 |
| JP | 2015-106605 | 6/2015 |

* cited by examiner

○ :OK
× :NG

BLANKING APERTURE ARRAY, METHOD FOR MANUFACTURING BLANKING APERTURE ARRAY, AND MULTI-CHARGED PARTICLE BEAM WRITING APPARATUS

CROSS REFERENCE TO RELATED APPLICATION

This application is based upon and claims benefit of priority from the Japanese Patent Application No. 2016-136879, filed on Jul. 11, 2016, the entire contents of which are incorporated herein by reference.

FIELD

The present invention relates to a blanking aperture array, a method for manufacturing blanking aperture array, and a multi-charged particle beam writing apparatus.

BACKGROUND

The progress of scaling of LSIs has led to finer and finer circuit line widths of semiconductor devices. An approach employed to form desired circuit patterns on semiconductor devices uses a step-and-repeat exposure system to demagnify and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

An exemplary known electron-beam writing apparatus is a multibeam writing apparatus in which a multibeam is used to emit many beams at a time for improvement in throughput. In this multibeam writing apparatus, for example, an electron beam emitted from an electron gun passes through an aperture plate having multiple holes. Thus, multiple beams are formed, and each of the beams is subjected to blanking control by using a blanking aperture array. Beams that have not been deflected through the blanking control are demagnified by using an optical system, and exposing a blanks, which is a writing target, at a desired position.

Multiple holes are formed in a blanking aperture array. A pair of electrodes (blanker) is provided in a portion close to each of the holes. By applying a given voltage between the pair of electrodes, a beam is subjected to blanking deflection, and enters the beam OFF state.

Many blankers are provided on the blanking aperture array. The blankers may include a blanker that is not capable of applying a desired voltage between the electrodes. Such a blanker is not capable of entering the beam OFF state through control. A defective beam that is always in the beam ON state is produced. Therefore, a problem has arisen in that the writing accuracy is deteriorated.

DETAILED DESCRIPTION

In one embodiment, a blanking aperture array is for a multi-charged particle beam writing apparatus. The blanking aperture array includes a substrate and a plurality of blankers. Each of the plurality of blankers includes a blanking electrode and a ground electrode that are formed on a first surface of the substrate. The plurality of blankers includes at least a normal blanker which is capable of applying a predetermined voltage between the blanking electrode and the ground electrode and for which a through hole bored through the substrate is formed, and a defective blanker which is not capable of applying the predetermined voltage between the blanking electrode and the ground electrode and for which the through hole bored through the substrate is filled with a beam shield.

Embodiments of the present invention will be described below with reference to the drawings.

First Embodiment

Figure 1:
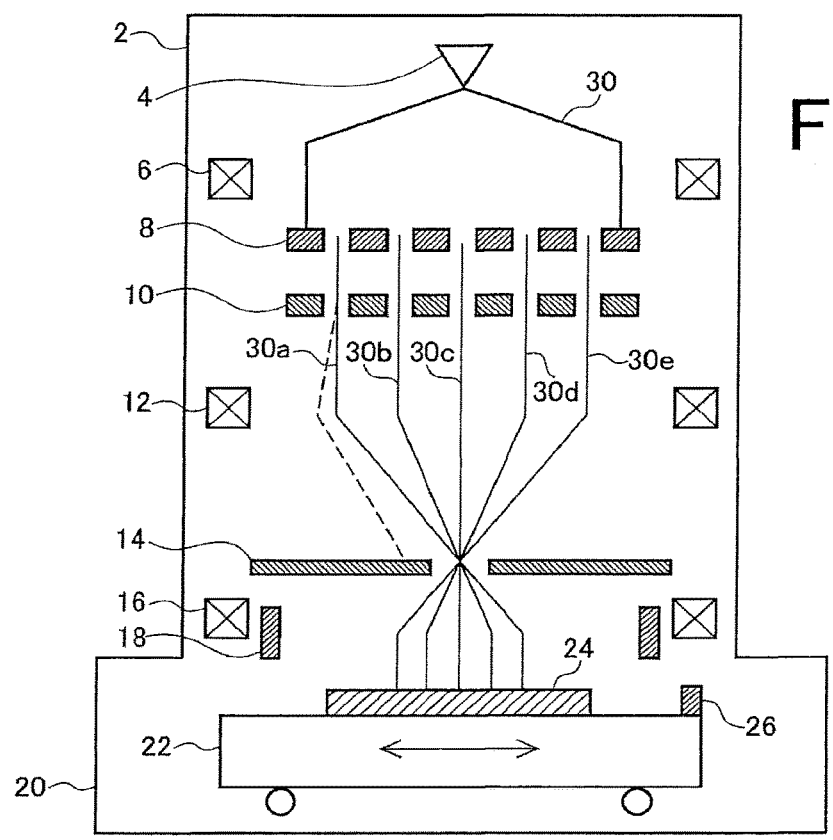
FIG. 1 is a schematic view of a multi-charged particle beam writing apparatus according to a first embodiment of the present invention.

FIG. 1 is a schematic view of a multi-charged particle beam writing apparatus in which a blanking aperture array according to a first embodiment is mounted. In the present embodiment, a configuration using an electron beam that is an exemplary charged particle beam will be described. However, the charged particle beam is not limited to an electron beam, and may be another charged particle beam such as an ion beam.

The writing apparatus illustrated in FIG. 1 includes an electron-beam column 2 and a writing chamber 20. In the electron-beam column 2, an electron gun 4, an illumination lens 6, an aperture plate 8, a blanking aperture array 10, a demagnification lens 12, a limiting aperture plate 14, an objective lens 16, and a deflector 18 are disposed.

In the writing chamber 20, an XY stage 22 is disposed. A substrate 24 that is a writing target is mounted on the XY stage 22. Examples of the substrate 24 that is a writing target include a wafer and a blanks for light exposure with which a pattern is transferred onto a wafer by using a demagnification projection exposure apparatus, such as a stepper or a scanner, using an excimer laser as a light source, or by using an extreme ultraviolet exposure apparatus (EUV). The examples of the substrate 24 also include a mask on which a pattern is already formed. For example, a Levenson mask needs two writing operations. Therefore, on an object that has been written once and that has been processed as a mask, a second pattern may be written. On the XY stage 22, a mirror 26 for measuring the position of the XY stage 22 is further disposed.

Figure 2:
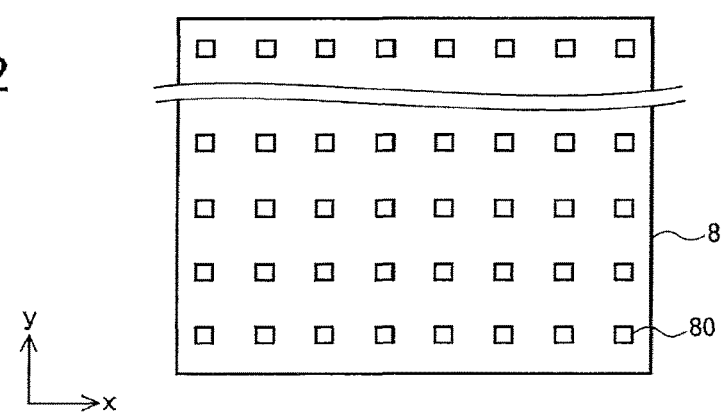
FIG. 2 is a schematic view of an aperture plate.

An electron beam 30 emitted from the electron gun 4 illuminates the entire aperture plate 8 appropriately vertically by using the illumination lens 6. FIG. 2 is a conceptual diagram illustrating the configuration of the aperture plate 8. On the aperture plate 8, holes (apertures) 80 of m vertical (y-direction) rows×n horizontal (x-direction) columns (m, n≥2) are formed at a given arrangement pitch in a matrix. For example, the holes 80 of 512 rows×512 columns are formed. Each of the holes 80 is formed in a rectangular shape having the same dimensions. Each of the holes 80 may be formed in a circular shape having the same diameter.

The electron beam 30 illuminates a region including all of the holes 80 of the aperture plate 8. Parts of the electron beam 30 pass through the respective holes 80 so that multiple beams 30a to 30e as illustrated in FIG. 1 are formed.

FIG. 2 illustrates an example in which the holes 80 are arranged in vertical and horizontal directions (x and y directions). In each of the vertical and horizontal directions, two holes or more are arranged. However, this is not limiting. For example, a configuration in which, in one of the vertical and horizontal directions (x and y direction), multiple holes are arranged, and in which, in the other direction, only one hole is arranged may be employed. The arrangement of the holes 80 is not limited to a case in which, in the vertical and horizontal directions, holes are arranged in a grid as illustrated in FIG. 2. For example, holes adjacent to each other in the vertical direction may be disposed in a staggered arrangement in a zigzag manner.

As described below, a through hole (a through hole 110 in FIG. 3) is formed in the blanking aperture array 10 in accordance with a position at which each of the holes 80 of the aperture plate 8 is disposed. A blanker (a blanker 106 including a ground electrode 107a and a blanking electrode 107b in FIG. 3) including two electrodes forming a pair is disposed for each of the through holes. Each of the electron beams 30a to 30e passing through the respective through holes is independently deflected by using a voltage applied by a corresponding one of the blankers. Through this deflection, each beam is subjected to blanking control. Thus, the blanking aperture array 10 is used to perform blanking deflection on each of the multiple beams having passed through the holes 80 of the aperture plate 8.

The multiple beams 30a to 30e having passed through the blanking aperture array 10 are demagnified in the beam size and the layout pitch by the demagnification lens 12, and travel to a hole formed at the center of the limiting aperture plate 14. The trajectory of an electron beam deflected by a blanker of the blanking aperture array 10 is displaced, and its position deviates from the hole at the center of the limiting aperture plate 14. The deflected electron beam is blocked by the limiting aperture plate 14. In contrast, an electron beam that has not been deflected by a blanker of the blanking aperture array 10 passes through the hole at the center of the limiting aperture plate 14.

Thus, beams are deflected by using electrodes of the blanking aperture array 10 so as to enter the beam OFF state, and the limiting aperture plate 14 blocks each of the deflected beams. Beams having passed through the limiting aperture plate 14 in a period from the beam ON state to the beam OFF state are beams for one shot.

The multiple beams 30a to 30e having passed through the limiting aperture plate 14 are focused by using the objective lens 16, and forms a pattern image of a desired reduction rate. The beams (the entire multibeam) having passed through the limiting aperture plate 14 are collectively deflected in the same direction by the deflector 18, and expose the substrate 24.

In an ideal state, the multiple beams for one illumination are arranged at a pitch obtained by multiplying the arrangement pitch of the holes 80 of the aperture plate 8 by the above-described desired demagnification rate. The writing apparatus performs a writing operation by using a raster scan system that sequentially and continuously emits a single-shot beam. In writing a desired pattern, beams necessary for the pattern are controlled through blanking control so as to enter the beam ON state. When the XY stage 22 continuously moves, the deflector 18 exerts beam tracking control so that the exposure positions of the beams follow the movement of the XY stage 22.

The units of the writing apparatus are controlled by a control device (not illustrated). The control device performs multiple stages of data conversion on writing data to generate shot data specific to the apparatus. In the shot data, the exposure amount, the exposure position coordinates, and the like for each shot are defined. The control device divides the exposure dose for each shot by a current density to obtain an exposure time t. In a corresponding shot, the control device applies a deflection voltage to corresponding blankers of the blanking aperture array 10 so that the beams enter the beam ON state only during the exposure time t.

The control device calculates a deflection amount so that beams are deflected to a position (coordinates) indicated by the shot data, and applies a deflection voltage to the deflector 18. Thus, the multiple beams that are to be emitted in that shot are collectively deflected.

Figure 3:
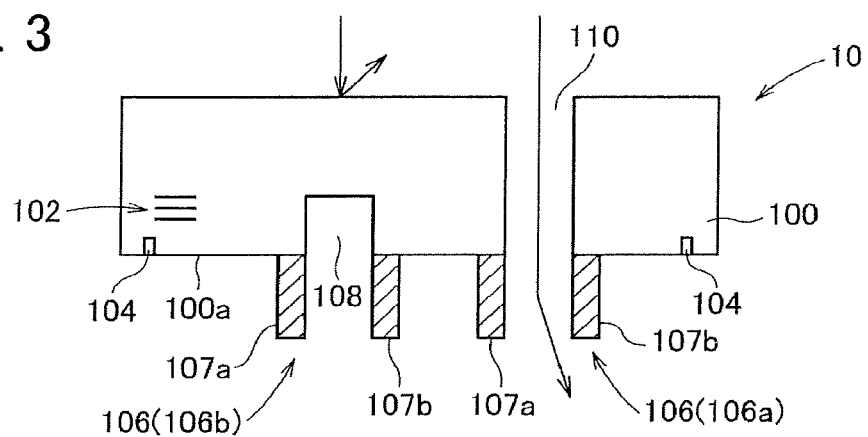
FIG. 3 is a sectional view of a blanking aperture array according to the first embodiment.

FIG. 3 is a sectional view of the blanking aperture array 10. The blanking aperture array 10 includes a substrate 100, a circuit unit 102, and multiple blankers 106. Each of the blankers 106 is disposed on a first surface 100a of the substrate 100, and includes a pair of the ground electrode 107a and the blanking electrode 107b. A given voltage (for example, 5 V) is applied between the ground electrode 107a and the blanking electrode 107b, achieving deflection of an electron beam.

In the substrate 100, multiple through holes 110 are arranged in a matrix in accordance with the positions at which the holes 80 (see FIG. 2) of the aperture plate 8 are disposed. The ground electrode 107a and the blanking electrode 107b are disposed so as to oppose each other with a through hole 110 interposed therebetween.

A through hole 110 is formed only for a normal blanker (normal cell) 106a that is capable of applying the predetermined voltage between the ground electrode 107a and the blanking electrode 107b. A through hole 110 is not formed for a defective blanker (defective cell) 106b that is not capable of applying the predetermined voltage between the ground electrode 107a and the blanking electrode 107b, and only a recess 108 is formed on the surface 100a. The depth of a recess 108 is smaller than the thickness of the substrate 100. For the defective cell 106b, the electrodes 107a and 107b are disposed with a recess 108 interposed therebetween.

Since the through hole 110 for the defective cell 106b is not open, a beam does not pass through the defective cell 106b, and a defective beam that is always in the beam ON state is prevented from being produced, improving the writing accuracy.

A method for manufacturing such a blanking aperture array 10 will be described by using FIGS. 4A to 4D.

Figure 4A:
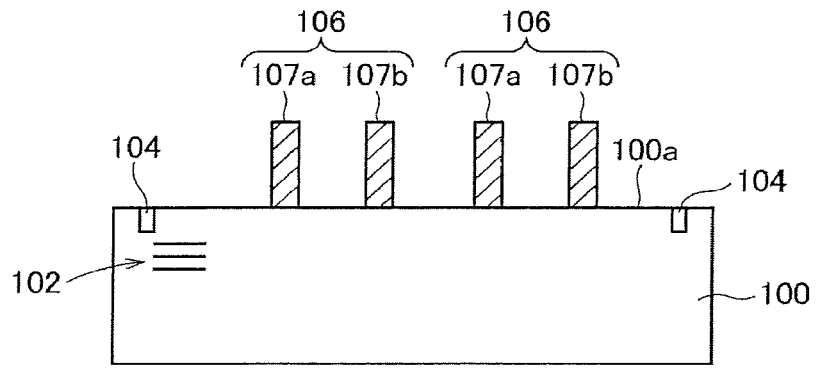
FIGS. 4A to 4D are process sectional views for describing a method for manufacturing the blanking aperture array according to the first embodiment.

As illustrated in FIG. 4A, the circuit unit 102 including transistors, wiring lines, and the like is formed in the substrate 100 through a known CMOS process. The substrate 100 is, for example, a silicon wafer. Subsequently, alignment marks 104 are formed on the first surface 100a of the substrate 100 through etching. Then, electroplating using Au or the like is performed, and blankers 106, each of which has the ground electrode 107a and the blanking electrode 107b, are formed on the surface 100a. The blankers 106 are formed in a matrix in accordance with the positions at which the holes 80 of the aperture plate 8 are disposed.

Figure 4B:
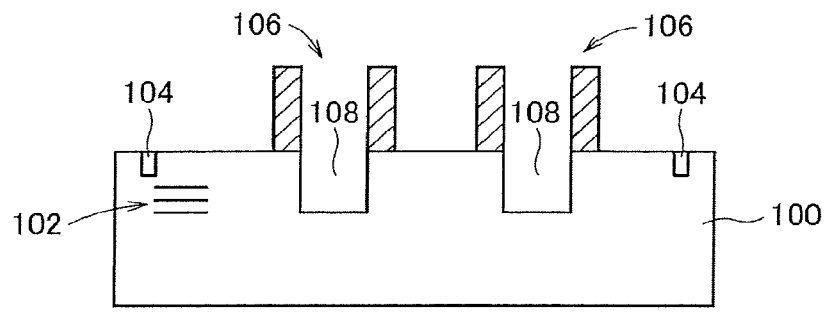

As illustrated in FIG. 4B, etching is performed on the first surface 100a of the substrate 100, and recesses 108 are formed between the ground electrodes 107a and the blanking electrodes 107b. The depth of the recesses 108 is smaller than the thickness of the substrate 100, and is, for example, about one fifth of the thickness of the substrate 100.

Figure 5A:
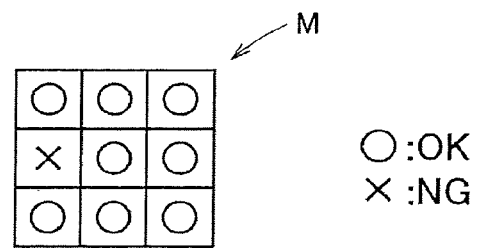
FIG. 5A is a diagram illustrating an exemplary defective cell map.

Subsequently, for each of the blankers 106, a test for determining whether or not the predetermined voltage may be applied between the ground electrode 107a and the blanking electrode 107b is performed, and a map (defective cell map) for defective cells that are not capable of applying the predetermined blanking voltage (for example, 5 V) and that are always in the beam ON state is generated. For example, a defective cell map M as illustrated in FIG. 5A is generated. FIG. 5A illustrates an exemplary defective cell map of blankers 106 of 3×3, in which "OK" indicates a normal cell and "NG" indicates a defective cell.

Figure 4C:
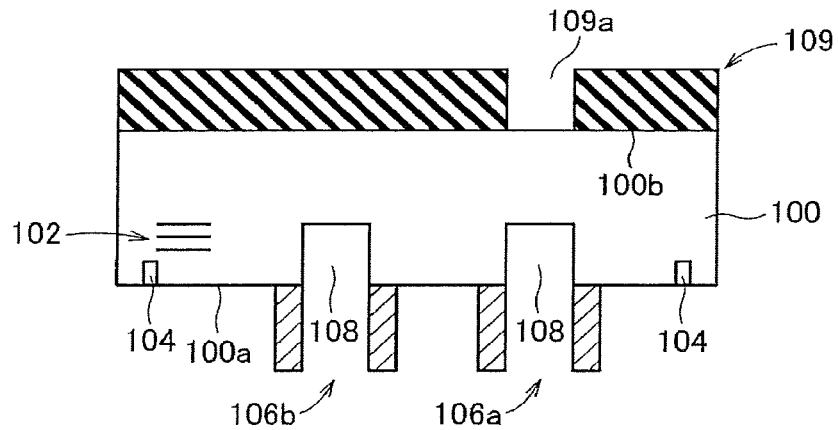

As illustrated in FIG. 4C, the substrate 100 is inverted. A known photolithography technique is used to form a resist pattern 109 having openings 109a only for the normal cells 106a, on a second surface 100b of the substrate 100. At that time, the alignment marks 104 formed on the surface 100a are used to achieve alignment. Thus, the openings 109a may be disposed with respect to the recesses 108 with high accuracy.

Figure 4D:
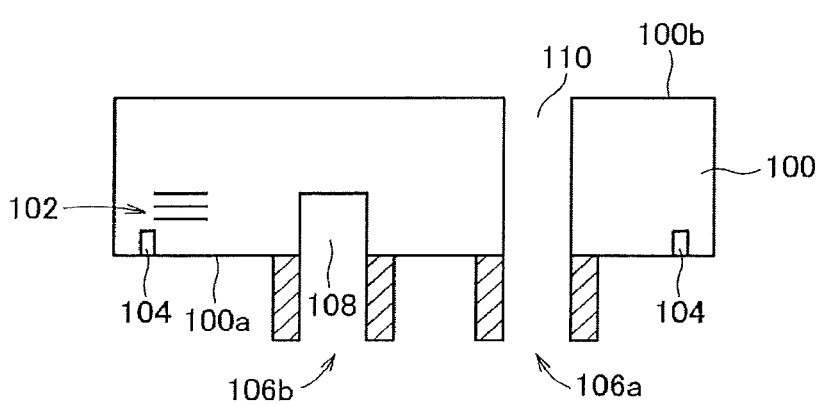

Then, the resist pattern 109 is used as a mask, and etching is performed on the substrate 100 so that the resulting holes connect with recesses 108. Thus, as illustrated in FIG. 4D, the through holes 110 are formed. After formation of the through holes 110, the resist pattern 109 is removed through ashing or the like.

Figure 5B:
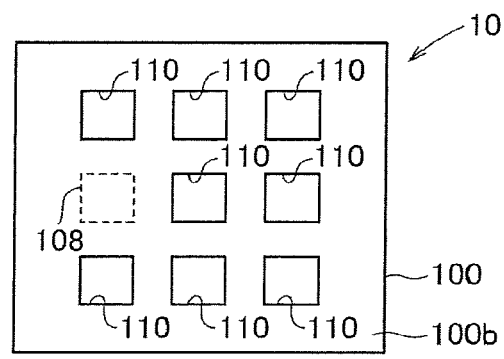
FIG. 5B is a plan view of the blanking aperture array.

Thus, through holes 110 may be formed only for the normal cells 106a, and are not formed for the defective cells 106b. FIG. 5B is a plan view obtained by viewing, from the surface 100b side, the blanking aperture array 10 manufactured when the defective cell map M illustrated in FIG. 5A is obtained. A through hole 110 is not formed for the defective cell 106b, and only a recess 108 is formed on the surface 100a side.

In other words, for the defective cell 106b, a through hole 110 is filled with the material of the substrate 100 so that an electron beam is blocked. Thus, a defective beam that is not subjected to blanking deflection and that is always in the beam ON state is prevented from being produced. A defective beam may be prevented from exposing the substrate 24 that is a writing target, improving the writing accuracy.

Second Embodiment

In the blanking aperture array 10 according to the first embodiment, the material of the substrate 100 between the bottom surface of a recess 108 and the surface 100b of the substrate 100 is used as a beam shield with which a through hole 110 is filled. Alternatively, a heavy metal having a higher beam-blocking capability may be used as a beam shield.

Figure 6:
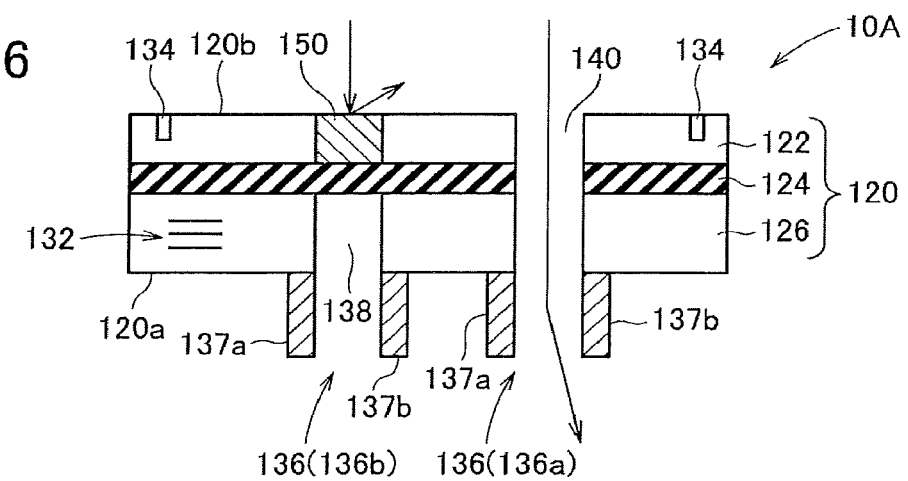
FIG. 6 is a sectional view of a blanking aperture array according to a second embodiment.

FIG. 6 is a sectional view of a blanking aperture array 10A including beam shields 150 containing a heavy metal. The blanking aperture array 10A includes a substrate 120, a circuit unit 132, and multiple blankers 136.

The substrate 120 is an SOI (Silicon On Insulator) substrate in which a silicon oxide film 124 is inserted between a silicon layer 122 and a silicon layer 126.

Each of the blankers 136 is disposed on a first surface 120a of the substrate 120, and includes a pair of a ground electrode 137a and a blanking electrode 137b. A predetermined voltage (for example, 5 V) is applied between the ground electrode 137a and the blanking electrode 137b so that an electron beam may be deflected.

In the substrate 120, multiple through holes 140 are arranged in a matrix in accordance with the positions at which the holes 80 (see FIG. 2) of the aperture plate 8 are disposed. The ground electrode 137a and the blanking electrode 137b are disposed so as to oppose each other with a through hole 140 interposed therebetween.

A through hole 140 is formed only for a normal blanker (normal cell) 136a that is capable of applying the predetermined voltage between the ground electrode 137a and the blanking electrode 137b. A through hole 140 is not formed for a defective blanker (defective cell) 136b that is not capable of applying the predetermined voltage between the ground electrode 137a and the blanking electrode 137b. A recess 138 is formed on the surface 120a of the substrate 120, and a beam shield 150 is formed (embedded) on the surface 120b side. The depth of a recess 138 is smaller than the thickness of the substrate 120. For the defective cell 136b, a pair of the electrodes 137a and 137b is disposed with a recess 138 interposed therebetween.

A beam shield 150 contains a heavy metal, such as tungsten or tantalum.

Since the through hole 140 for the defective cell 136b is not open, a defective beam that is always in the beam ON state is prevented from being produced, improving the writing accuracy. The defective cell 136b has a configuration in which a through hole 140 is filled with a beam shield 150 containing a heavy metal. Therefore, an electron beam may be effectively blocked.

A method for manufacturing such a blanking aperture array 10A will be described by using FIGS. 7A to 7C and 8D to 8F.

Figure 7A:
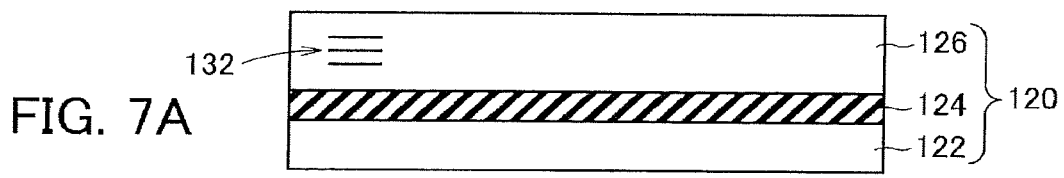
FIGS. 7A to 7C are process sectional views for describing a method for manufacturing the blanking aperture array according to the second embodiment.

As illustrated in FIG. 7A, the circuit unit 132 including transistor, wiring lines, and the like is formed in the silicon layer 126 of the substrate 120 through a known CMOS process.

Figure 7B:
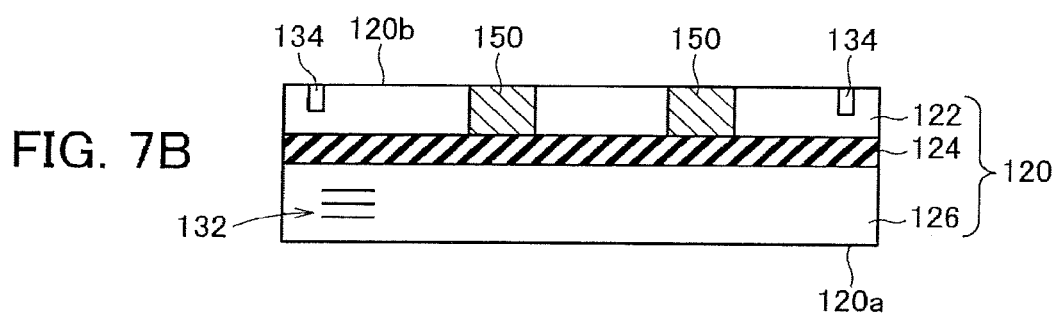

Then, as illustrated in FIG. 7B, the substrate 120 is inverted, and alignment marks 134 are formed on the surface 120b (silicon layer 122) through etching. Multiple recesses are formed in the silicon layer 122 through etching, and the beam shields 150 are formed by embedding a heavy metal material, such as tungsten or tantalum, in the recesses. In etching for forming recesses, the silicon oxide film 124 serves as a stopper. The beam shields 150 are formed in a matrix in accordance with the positions at which the holes 80 (see FIG. 2) of the aperture plate 8 are disposed.

Figure 7C:
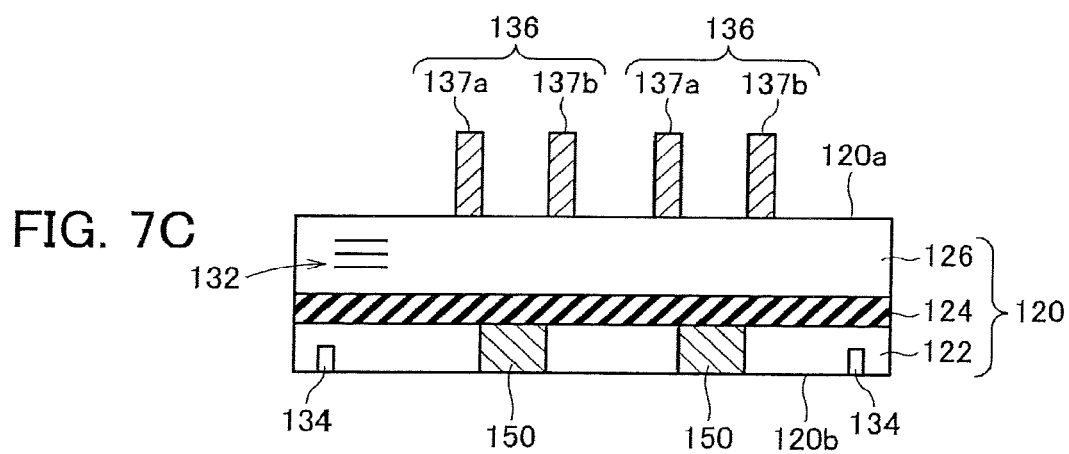

As illustrated in FIG. 7C, the substrate 120 is inverted again. Electroplating using Au or the like is performed, and multiple blankers 136, each of which has the ground electrode 137a and the blanking electrode 137b, are formed on the surface 120a. The blankers 136 are formed in a matrix in accordance with the positions at which the holes 80 of the aperture plate 8 are disposed, that is, in accordance with the positions of the beam shields 150. At that time, the alignment marks 134 formed on the surface 120b are used to achieve alignment. Thus, the blankers 136 may be disposed with respect to the beam shields 150 with high accuracy.

Figure 8D:
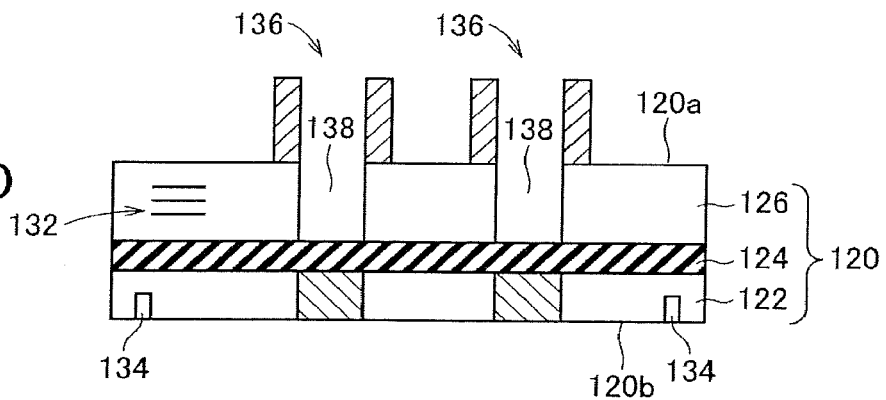
FIGS. 8D to 8F are process sectional views for describing the method for manufacturing the blanking aperture array according to the second embodiment.

As illustrated in FIG. 8D, etching is performed on the silicon layer 126 from the surface 120a of the substrate 120, and recesses 138 are formed between the ground electrodes 137a and the blanking electrodes 137b. In etching for forming the recesses 138, the silicon oxide film 124 serves as a stopper.

Subsequently, for each of the blankers 136, a test for determining whether or not the given voltage may be applied between the ground electrode 137a and the blanking electrode 137b is performed, and a map (defective cell map) for defective cells that are not capable of applying the given blanking voltage (for example, 5 V) and that are always in the beam ON state is generated.

Figure 8E:
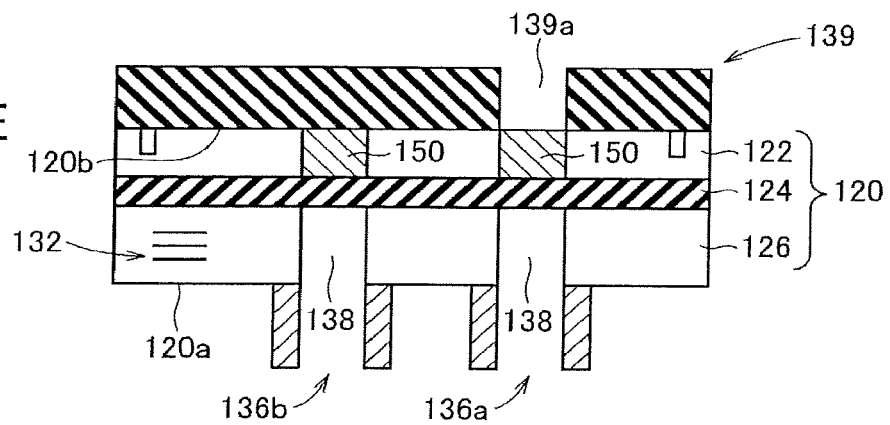

As illustrated in FIG. 8E, the substrate 120 is inverted, and a known photolithography technique is used to form a resist pattern 139 having openings 139a only for the normal cells 136a on the surface 120b of the substrate 120. At that time, the alignment marks 134 formed on the surface 120b are used to achieve alignment. Thus, the resist pattern 139 may be disposed with respect to the beam shields 150 with high accuracy. For each of the normal cells 136a, the surface of the beam shield 150 is exposed through the opening 139a.

Figure 8F:
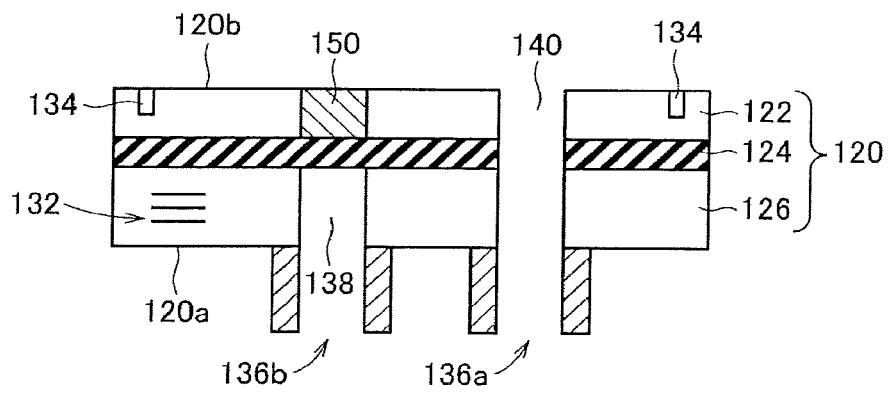

Then, etching is performed on the substrate 120 (the embedded beam shields 150 and the silicon oxide film 124) by using the resist pattern 139 as a mask, and the resulting holes connect with recesses 138. Thus, as illustrated in FIG. 8F, the through holes 140 are formed. In formation of the through holes 140, the beam shields 150 for the normal cells 136a are removed. After formation of the through holes 140, the resist pattern 139 is removed through ashing or the like.

Thus, through holes 140 may be formed only for the normal cells 136a, and through holes 140 may not be formed for the defective cells 136b. For the defective cells 136b, no through holes 140 are formed, and only recesses 138 are formed on the surface 120a.

Each of the defective cells 136b has a configuration in which a through hole 140 is filled with a beam shield 150 (and the silicon oxide film 124), and an electron beam is blocked. Thus, a defective beam that is not subjected to blanking deflection and that is always in the beam ON state is prevented from being produced. In addition, the beam shields 150 contain a heavy metal, enabling an electron beam to be effectively blocked.

In the second embodiment, the beam shields 150 containing a heavy metal are provided only for the defective cells 136b. However, a beam shield 150 may be formed on the entire surface of the surface 120b of the substrate 120, and the portions only for the normal cells 136a may be removed. Thus, the through holes 140 may be formed.

In the blanking aperture array 10 according to the first embodiment, an SOI substrate may be used. In the blanking aperture array 10A according to the second embodiment, a silicon substrate may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A blanking aperture array for a multi-charged particle beam writing apparatus, the blanking aperture array comprising:
a substrate; and
a plurality of blankers, each of the plurality of blankers including a blanking electrode and a ground electrode that are formed on a first surface of the substrate,
wherein the plurality of blankers includes at least
a normal blanker which is capable of applying a predetermined voltage between the blanking electrode and the ground electrode and for which a through hole bored through the substrate is formed, and
a defective blanker which is not capable of applying the predetermined voltage between the blanking electrode and the ground electrode and for which the through hole bored through the substrate is filled with a beam shield,
wherein, for the defective blanker, a recess is disposed on the first surface of the substrate, and
wherein a substrate body between a bottom surface of the recess and a second surface of the substrate serves as the beam shield.

2. The blanking aperture array according to claim 1, wherein the substrate is an SOI substrate.

3. A multi-charged particle beam writing apparatus comprising:
a movable stage that is a stage on which a target is mounted;
an emitting unit that emits a charged particle beam;
an aperture plate that has a plurality of openings formed therein and that is used to form a multibeam in such a manner that parts of the charged particle beam pass through the respective openings;
a blanking aperture array that separately exerts beam ON/OFF control on individual beams included in the multibeam; and
a deflector that collectively deflects beams having passed through the blanking aperture array, the deflection being performed in such a manner that the beams expose the target at respective exposure positions,
wherein the blanking aperture array includes a substrate and a plurality of blankers, each of the plurality of blankers including a blanking electrode and a ground electrode that are formed on a first surface of the substrate, and
wherein the plurality of blankers includes at least
a normal blanker which is capable of applying a predetermined voltage between the blanking electrode and the ground electrode and for which a through hole bored through the substrate is formed, and
a defective blanker which is not capable of applying the predetermined voltage between the blanking electrode and the ground electrode and for which the through hole bored through the substrate is filled with a beam shield,
wherein, for the defective blanker, a recess is disposed on the first surface of the substrate, and
wherein a substrate body between a bottom surface of the recess and a second surface of the substrate serves as the beam shield.

4. The apparatus according to claim 3, wherein the substrate is an SOI substrate.

* * * * *